United States Patent [19]

Takács et al.

[11] 4,357,306
[45] Nov. 2, 1982

[54] CRYSTALLIZATION APPARATUS

[75] Inventors: István Takács; József Felméri; György Kerey; Péter Rudolf; Zoltán Bános; Endre Vereczkey; Gyula Bosits, all of Budapest, Hungary

[73] Assignee: Richter Gedeon Vegyészeti Gyár Rt., Budapest, Hungary

[21] Appl. No.: 131,826

[22] Filed: Mar. 19, 1980

[30] Foreign Application Priority Data

Mar. 21, 1979 [HU] Hungary ................. RI-704

[51] Int. Cl.³ .............................................. B01D 9/02
[52] U.S. Cl. ............................................... 422/254
[58] Field of Search ............... 62/532, 541, 542, 544; 422/254, 253, 245, 251; 23/295 R

[56] References Cited

U.S. PATENT DOCUMENTS

| | | |
|---|---|---|
| 2,757,216 | 7/1956 | Speed et al. .................. 422/254 |
| 2,898,271 | 8/1959 | Findlay ......................... 422/254 |
| 3,388,893 | 6/1968 | Hall ............................... 34/129 |
| 3,599,701 | 8/1971 | Mollerstedt ................... 422/253 |
| 3,900,292 | 8/1975 | Fairchild ...................... 422/245 |
| 4,025,573 | 5/1977 | Hathaway ..................... 62/532 |
| 4,159,194 | 6/1979 | Steward ........................ 422/245 |

*Primary Examiner*—Hiram Bernstein
*Attorney, Agent, or Firm*—Karl F. Ross

[57] ABSTRACT

An apparatus for crystallization which utilizes a treating device for the formation of a crystal slurry having a prismatic drum at the inlet end of the device and a zigzag body eccentrically connected to the wide end of the drum and formed by ducts which have their axes intersecting the axis of the drum, the final duct section terminating at a ring which is coaxial with the drum. The duct walls are planar as well. The entire system is closed and includes a filter having a prismatic drum and duct arrangement but with walls which are perforated.

5 Claims, 1 Drawing Figure

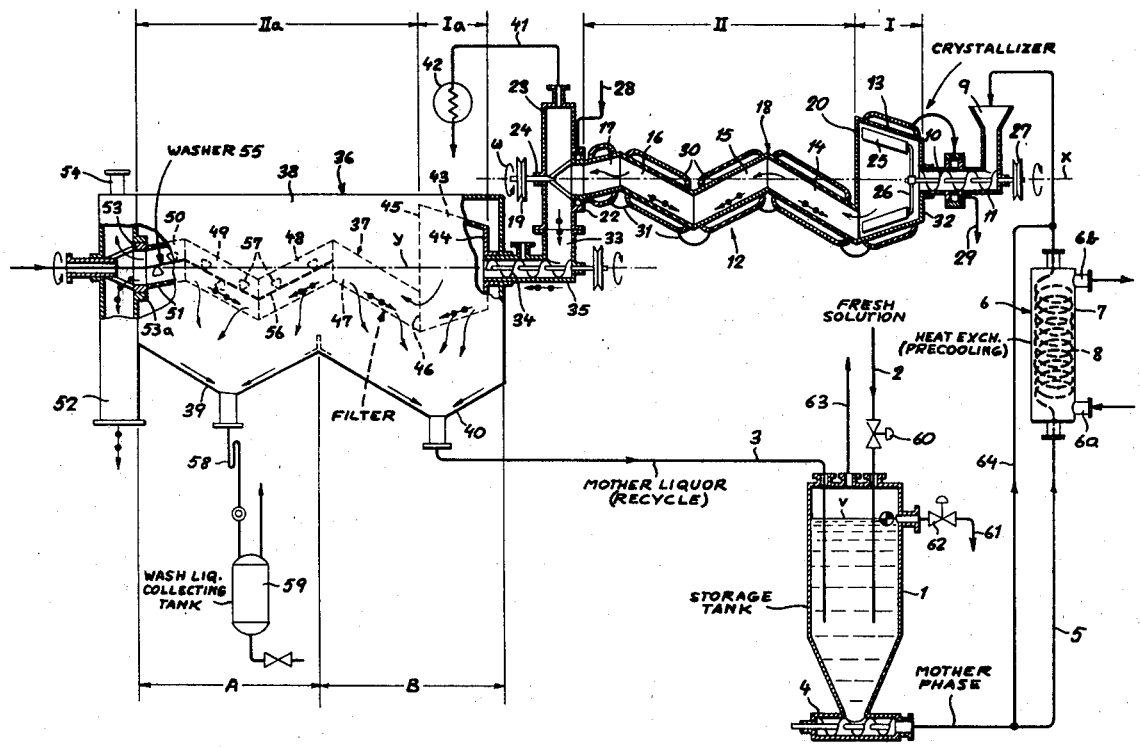

CRYSTALLIZATION APPARATUS

FIELD OF THE INVENTION

The invention relates to a process for the extraction of solids from solution by crystallization.

BACKGROUND OF THE INVENTION

In the chemical-, pharmaceutical industry and in other industrial sectors it is an essential task to produce crystalline, solid material from solution, which is easily treatable in the course of subsequent processes. Several crystallizers are known, functioning with cooling, distillation, evaporation cooling or pulverization.

A cooling crystallizer with grading screw is described by: Dr. Mucskai L. "Kristályosítás" ("Crystallization"), Müszaki Könyvkiadó, Budapest, 1971, page 151. This equipment has a mother liquor tank, cooler and grading screw at an angle above the mother liquor tank. The warm, fresh solution passes into the mother liquor tank where it is mixed with the mother lye arriving on overflow from the grading screw. The crystal slurry after passing through the cooler enters the grading screw, which has a sloping, trough-shaped bottom, on the lower part of which the larger crystals settle. These are removed from the trough by the screw. The mother liquor overflowing from the grader—together with the smaller crystals—flows back into the mother liquor tank, then into the circulation of the cooling cycle. The disadvantage of this process is that the method of grading two fractions—to the material discharged by the screw and the material returned with the mother liquor—is difficult, because the grading has to be ensured by regulating the velocity of the flowing medium, at the same time the crystallization process is also a function of the flow velocity. Owing to these difficulties, this process has not gained acceptance.

OBJECTS OF THE INVENTION

The objects of the invention is to provide a process and apparatus for the extraction of solids from solution by crystallization, as a result of which highly pure crystals of graded grain size can be obtained with a safe apparatus of simple construction and continuous operation.

SUMMARY OF THE INVENTION

The invention is based on the recognition that when grading of the crystal slurry is carried out with continuous filtering, then crystalline material of excellent quality and graded very keenly according to grain size is obtained, the purity of which can be considerably increased with washing immediately after or during the filtration; on the other hand seeding of the fresh solution with mother liquor containing a fraction of smaller grain size than the separated one, can be ensured by dispensing with seeding of the solution with crystal nodules and such crystal nodules may occur only eventually in a very small quantity during the processes. According to a further significant recognition, when the material is kept in constant motion along the cooled surfaces during cooling and filtering, these surfaces will be continually regenerated, the crystal slurry can be kept in the metastable zone, namely in the most favorable state in respect to the crystallization, i.e. on the border of the transition to the unstable zone, thus the supersaturation of the mother phase does not take place in the vicinity of the cooling surface, crystallization of the cooling surface is eliminated, and intensity of the crystal growth is maximal.

On the basis of this recognition, the process according to the invention calls for the mixture of the fresh solution and mother liquor of lower temperature to form a mother phase in the metastable range, where crystallization begins, the mother phase being further cooled to such an extent as to remain in the metastable range, increasing the crystal growth the crystals are then separated from the crystal slurry, and this process is characterized by carrying out the crystal separation from the crystal slurry by grading the crystal slurry with continuous filtration in such a way that the crystal slurry is separated only to the fraction containing crystal grains of the required size, and to the mother liquor containing crystals smaller than the former ones and the so-obtained mother liquor being continuously mixed with fresh solution; the fresh solution together with the crystal grains in the mother liquor settles down by gravity, while the liquid mother phase of lower specific gravity than that of the fresh solution is discharged; formation of the crystal slurry is intensified by cooling and simultaneous movement of the mother phase containing crystals separated from the mother liquor and the fresh solution, the crystal slurry being filtered the above operations are repeated at a continuous rate. According to a preferable implementation method of the process the mother liquor is returned to the fresh solution in a quantity exceeding 2 to 15 times the quantity of the discharged solution not containing solids.

The main feature of the apparatus for the continuous process is that it is provided with a storage tank for mixing of the fresh solution and mother liquor; pipeline and connected pump for delivery of the mother phase; treating device for the formation of crystal slurry from the mother phase by cooling; device for filtering the crystal slurry; pipeline for feeding of the mother liquor containing crystals separated by the filtration into the storage tank, whereby the tank, treating device and filter device are interconnected in a closed system.

The advantages of the invention can be summed up as follows:

The invention ensures a graded product of excellent quality, distribution of the crystal grains is uniform, their size is large, shape convenient, compact. The impurity can be simply washed down from the crystals in the filter device. Space requirement for the apparatus group is small, its investment and running costs are economical. In spite of the fact that the material handling during the process is gentle, there is no sedimentation or crystallization on the walls due to the constant sliding movement of the material. As a result of the regulated cooling no large number of crystal nodules or large number of small crystals occur, the crystals grow constantly in the treating device, the temperature difference between the cooling surface and crystal slurry is not excessive, thus the crystal nodules do not settle on the surface. The gentle movement prevents the large-size crystals from fragmentation and the small-size crystals from sticking together. Seeding of the solution with crystal nodules is not necessary, since the crystal slurry kept in suspension in the mother liquor tank always contains crystals of small grain size in sufficient quantity to start off the crystallization, and the fresh solution is fed continuously to this crystal slurry, i.e. the process is self-seeding. The heat transfer coefficient within the treating device is extremely favorable due to the mixing. The grain quality (size, shape) suitable for the existing demands depends on the ratio of the mother phase and mother lye, as well as on the r.p.m. of the treating body and on the angle of the treating device and/or filter to the horizontal; their variation enables the control of the quality. The solvent leaving the equipment can be recovered by condensation of the vapours. The crystal size can be influenced also by taking the ratio of the grading crystal suspension - mother liquor from the filter—and the solution from the gravitational sedimentator not containing solids to a high value, i.e. the ratio of recirculation is high. In this case for instance the crystal grains may be large, but only a relatively small proportion is obtained from the process.

BRIEF DESCRIPTION OF THE DRAWING

The invention is described in detail on the basis of the sole FIGURE of the drawing showing a preferable embodiment of the apparatus used for the continuous process.

SPECIFIC DESCRIPTION

The apparatus has a storage tank 1, a pipe 2 for admission of the fresh solution from the top, and a pipe 3 for feeding in the mother liquor, while the lower tapered part of tank 1—at the lowest point—ends in a pump 4, connected with a pipe 5 for delivery of the mother phase. Pipe 5 contains a heat exchanger 6 provided with inlet pipe stub 6a at the bottom and outlet pipe stub 6b at the top. A pipe 8 runs concentrically in the vertical cylindrical tank 7 of the heat exchanger 6. Pipe 5 ends at hopper 9 to which the worm conveyor 10 is connected. The cylindrical housing 11 of the worm conveyor serves as one of the mechanical axes of rotation of the mixer device 12, coinciding with the longitudinal horizontal geometrical axis x. The treating device 12 has a first section I and second section II; the first one is formed by a truncated cone-shaped drum 13 and the latter one is formed by the polygonal prismatic members 14, 15, 16 and 17 leading into each other and rigidly connected to each other and to the drum 13. Drum 13 and members 14, 15, 16 and 17 together form a hollow body 18, rotatable along the geometrical longitudinal axis x with the aid of drive 19 in the direction of arrow ω. Opening 21 eccentrically arranged in relation to the axis x is formed in the large end plate 20 of drum 13, the first prismatic member 14 joining the opening 21 in such a way that its (not illustrated) geometrical longitudinal axis intersects the geometrical longitudinal axis x of the hollow body 18 outside the drum 13. The geometrical longitudinal axes of members 14, 15, 16 and 17 form a zig-zag line with each other, and the axis of each member intersects the geometrical longitudinal axis x outside the drum 13. The members 14, 15, 16 and 17 together form a sawtooth shape. The last prismatic member 17 ends in a ring, rotating in a bearing 22 of fixed position. This latter one is fixed in the wall of a stationary box 23. The axis 24 of the hollow body 18 is carried on bearing in the other side wall of the box 23; this axis is connected with the already mentioned drive 19. The worm conveyor 10 extends into the interior of drum 13, through its side plate 32. Mixer 26 provided with blades 25 is arranged in drum 13, the blades running along the inner surface of the tapered jacket with a small spacing parallel with the generatrices of the surface. The mixer rotates counter to the direction of rotation of the drum. Mixer 26 is rotated for instance from the shaft of worm conveyor 10 with drive 27. The walls of both the drum 13 and prismatic members 14, 15, 16 and 17 are solid (not perforated) and the walls are duplicated separately, forming jackets to which a cooling medium can be supplied from pipeline 28, the heated cooling medium being discharged through pipe 29. The duplicated, closed spaces are interconnected with pipes 31. Pipe 41 emerges from the cover of box 23 leading into the heat exchanger 42. Otherwise the treating device 12 is described in detail in the Hungarian patent application no. RI-699 (which corresponds to U.S. Ser. No. 98,042 filed Nov. 28, 1979).

Pipe 33 extends downward from the lower part of box 23 leading into the worm conveyor 34. This latter one has a cylindrical housing 35, serving as the mechanical axis of rotation of the hollow body 37 of the filter device marked with reference number 36. Filter device 36 has a closed housing 38 at the bottom of which troughs 39 and 40 are formed. The hollow body 37 runs in the closed house 38 in longitudinal direction and it is provided with first section Ia and second section IIa. The first section Ia is formed by the truncated cone-shaped drum 43 through the smaller end plate 44 by which the screw is 34 led into the interior of the drum, while the polygonal opening 46 is formed in the larger end plate 45. Opening 46 is eccentrically arranged in relation to the longitudinal horizontal geometrical axis of rotation y of the hollow body 37. Section IIa is formed by four rigidly interconnected polygonal prismatic members 47, 48, 49 and 50 leading into each other, the geometrical longitudinal axis of which together form a zig-zag line, thus the members 47, 48, 49 and 50 appear in sawtooth shape. The first member 47 is rigidly connected to the eccentric opening 46 of drum 43 in such a way that its geometrical longitudinal axis intersects the longitudinal axis of the hollow body 37 outside the drum 43, likewise as the geometrical longitudinal axes of members 48, 49 and 50. The walls of the drum and members are formed by the filter 51, or sieve (e.g. perforated plate, net, etc.). The last prismatic member 50—with a ring 53 at its end - is rotatable in bearing 53a fixed to the side wall of the stationary box 52, this last member leading into the box 52 which is open at the bottom, while pipe 54 emerges from the top. The washing device 55 extends through the last three members 48, 49 and 50, the pipe 56 of the washing device 55 being fitted with spray heads 57. Pipe 56 passes from the hollow body 37 through the box 50 and is connected to a (not illustrated) liquid source. The washing device 55 is in co-rotation with the hollow body 37. For the sake of simplicity the drive of the hollow body is not shown. The section of the hollow body 37 containing the washing device 55 is marked with reference letter A, the other section formed by drum 43 and prismatic member 47 is marked with B.

The pipe 3 leading into tank 1 is branched off the trough 40 below section B. Pipe 58 leading into tank 59 is branched off the trough 39 below section A.

A regulator device 60 is built into the pipe 2 outside the tank 1 serving for admission of the fresh solution into the tank 1, the lower end of said pipe extending below the liquid level v. Pipe 61 emerges from tank 1 at the height of the liquid level v, into which the regulator device 62 is built. Gas outlet pipe 63 emerges from tank 1 at the top. Pipe 64 is branched off the pipe 5 before the heat exchanger 6, which is connected back to pipe 5 after the heat exchanger, but before the treating device 12.

The tank 7 of the heat exchanger 6 according to FIG. 1—depending on the demand for heat extraction—may contain more than one pipe 8, and instead of the illustrated uniflow cooling liquid, counterflow connection is also possible.

Operation of the equipment according to FIG. 1 is the as follows:

The fresh solution containing solids dissolved in warm, organic solvent is delivered through pipe 2 below a liquid level v—in the quantity regulated with the device 60—into tank 1, and in addition, the mother liquor containing crystals - and possibly small quantity of crystal nodules as well - obtained in the filter equipment 36 as a result of the continuous crystallization process, is also returned to the tank 1, through pipe 3. The crystal grains of higher specific gravity settle from the mother liquor at the bottom of tank 1, while the mother liquor of lower specific gravity not containing crystal grains is discharged—in a quantity regulated with the shut-off device 62—from tank 1 at the top through pipe 61. The mother phase accumulated at the bottom of tank 1 is pumped into pipe 5 with screw pump 4, then flows through heat exchanger 6 and subjected to preliminary cooling. The cooling medium enters the heat exchanger through pipe stub 6a at the bottom, withdraws heat from the mother phase and leaves through pipe stub 6b, while the mother phase flowing upwards in pipe 8 is subjected to preliminary cooling to the temperature required by the existing technological operation, then pumped into the hopper 9. (If precooling is not necessary the mother phase passes into the hopper 9 through branch pipe 64 by-passing the heat exchanger 6.)

The mother phase is fed with worm conveyor 10 into the rotary treating device 12, the interior of which is cooled with cold liquid through the jacketed walls. The mother phase in drum 13—i.e. in the first section I—is mixed with mixer 26 during the process of cooling, and the drum discharges the already partially crystallized material into the prismatic member 14 of the second section II.

Due to the rotation of members 14, 15, 16 and 17 which form a sawtooth shape in the second section II, the cooled, supersaturated solution—crystal slurry—dividing continuously during its progress, is forced into a forward-backward movement, sliding back repeatedly on the smooth internal surface (which is preferably of smooth, adhesion-resistant material, e.g. teflon), so that consequently the dwelling period of the crystal slurry in the treating device 12 is extended, in oher words the specific internal surface of the prismatic members 14, 15, 16 and 17 wetted with liquid is increased. As a result of the constantly dividing-sliding movement and operation of the mixer device 26, the internal surfaces of the hollow body 18 are constantly regenerated, the solid content of the crystal slurry does not stick to the surface, supersaturation of the mother phase can not occur in the vicinity of the cooling surface, the mother phase remains in the metastable zone, thus crystallization of the cooling surface is eliminated. In addition these material movements are very gentle, whereby not only the cohesion of the crystals, but their fragmentation is also excluded.

The cooled crystal slurry containing crystals of various grain size passes from the last prismatic member 17 of the treating device 12 into the box 23, then into the worm conveyor 34. The vapors released from the mother liquor pass from the upper part of box 23 through pipe 41 into the heat exchanger 42 (condenser, after-cooler) and are cooled down and condensed and thus will be collectible in the form of a liquid (solvent).

The crystal slurry is delivered with feeder screw 34 into the rotary hollow body 37 of the filter device 36, the hollow body being accomodated in the closed housing 38. The material first passes into drum 43—into the first section Ia of the filter device—where the large-size crystal grains are filtered out of the crystal slurry. The mass of material consisting of the filtered but still wet crystal grains is delivered by drum 43 into the first prismatic member 47 of the second section IIa and the material passes through the rotary sawtooth shape-forming members 47—48, 49, 50 of the second section IIa in such a way that it is forced into a forward-backward movement, sliding back repeatedly and thereby continuously regenerating the filter 51 or sieve surfaces. The dwelling period of the material and the specific surface of the sieve surfaces are considerably increased. Here the movement is also very gentle too, the crystals do not become fragmentary, and no coherence or sedimentation occurs on the surfaces.

There is no washing device in the range B of the second section IIa, thus the mother liquor (crystal suspension) passes off and accumulates in trough 40, then flows back continuously through pipe 3 into tank 1. The washing device 55 extends in the range A of the second section IIa, - i.e. in members 48, 49 and 50—through which washing liquid, e.g. organic solvent can be delivered to the crystalline mass of material which is in sliding motion. The impure washing liquid flowing through the sieves accumulates in tub 39, and from here it passes through pipes 58 into tank 59. The vapor ascending from the crystal slurry leaves the closed housing 38 through pipe 54. The separated, large crystals of uniform grain size pass continuously downward through pipe 52, and may be dried.

It is noted that the Hungarian patent application no. RI-699 gives a more detailed description of the filter device 36 (see copending application Ser. No. 98,042).

In the following the invention is described in detail by means of an example as follows:

The object is crystallization of phenylbutazon. Concentration of the solution: 58 g phenylbutazon/litre solvent at a temperature of 50° C. Composition of the solvent: 80% ethylalcohol, 20% water. Feeding temperature of the fresh solution: 50° C. Recirculation ratio of the mother liquor: Q=10. No precooling is applied. In both sections of the treating device 17° C. temperature is maintained. Temperature of the outgoing crystal slurry: 22° C., yield 98%, volume weight of the crystal aggregation: 25–32 g/100 ml. The crystal is compact, large sized, well treatable during tabletting.

What we claim is:

1. A crystallization apparatus comprising:
   a storage tank for mixing said solution with a mother liquor to form a mother phase;
   a treating device for the formation of a crystal slurry from the mother phase by cooling, said treating device being connected to said storage tank through a pump for delivery of the mother phase to said treating device; and
   a filter device for the filtration of the crystal slurry, said filter device being connected to said storage tank for feeding mother liquor containing crystals separated by said filtration into said storage tank, said treating device and said filter device being interconnected in a closed system, said filter device comprising:

a frustopyramidal prismatic drum rotatable about an axis and formed with perforated walls, an elongated zigzag body communicating eccentrically with a wide end of said drum and formed from planar perforated walls, said body being constituted by a plurality of angularly adjoining ducts and having a terminal one of said ducts rotatable about said axis, all of said ducts having individual axes intersecting the axis of said drum, means for receiving crystals from said body at said terminal duct, and a housing enclosing said drum and said body for draining liquid from the crystals therein.

2. The apparatus defined in claim 1 further comprising a heat exchanger in the connection between said storage tank and said treating device for the preliminary cooling of the mother phase before introduction into said treating device.

3. The apparatus defined in claim 2, wherein said treating device is formed by a first hollow body rotatable about a first horizontal axis, said first hollow body comprising:

a truncated first conical drum centered on said first horizontal axis and formed with a first inlet thereat, whereby said mother phase is fed into the interior of said first drum;

a first duct communicating with said first drum at a location offset from said first horizontal axis and having a first longitudinal axis forming an angle therewith;

a second duct communicating with said first duct at said first horizontal axis and having a second longitudinal axis forming an angle therewith;

a third duct communicating with said second duct at a location offset from said first horizontal axis and having a third longitudinal axis forming an angle therewith;

a fourth duct communicating with said third duct at said first horizontal axis and having fourth longitudinal axis forming an angle therewith, said fourth duct being formed with a first outlet centered on said first horizontal axis, whereby said crystal slurry is removed from said first hollow body; and jackets formed on said first, second, third and fourth ducts and on said drum, said jackets being interconnected for passing a temperature-controlled fluid therethrough.

4. The apparatus defined in claim 3 wherein said first drum is formed by a truncated pyramid.

5. A crystallization apparatus comprising:

a storage tank for mxing said solution with a mother liquor to form a mother phase;

a treating device for the formation of a crystal slurry from the mother phase by cooling, said treating device being connected to said storage tank through a pump for delivery of the mother phase to said treating device, said treating device comprising a frustopyramidal prismatic drum having flat imperforate walls and surrounded by a jacket, an elongated body eccentrically connected to a broad end of said drum and formed by a plurality of angularly adjoining ducts of polygonal cross section adjoining angularly in a zigzag pattern, said drum being rotatable about its axis whereby said body is swept around said axis, said body having a terminal one of said ducts opening at said axis, each of said ducts having planar imperforate walls, respective jackets formed on each of said ducts, and means for passing a cooling fluid through all of said jackets; and a filter device for the filtration of the crystal slurry, said filter device being connected to said storage tank for feeding mother liquor containing crystals separated by said filtration into said storage tank, said treating device and said filter device being interconnected in a closed system.

* * * * *